US006665354B1

(12) United States Patent
Drapkin et al.

(10) Patent No.: US 6,665,354 B1
(45) Date of Patent: Dec. 16, 2003

(54) DIFFERENTIAL INPUT RECEIVER AND METHOD FOR REDUCING NOISE

(75) Inventors: Oleg Drapkin, Richmond Hill (CA); Grigori Temkine, Toronto (CA)

(73) Assignee: ATI International SRL (BB)

( * ) Notice: Subject to any disclaimer, the term of this patent is extended or adjusted under 35 U.S.C. 154(b) by 0 days.

(21) Appl. No.: 09/388,976

(22) Filed: Sep. 2, 1999

(51) Int. Cl.$^7$ .......................... H04L 27/22; H03K 3/01

(52) U.S. Cl. .................. 375/316; 327/534; 327/537; 326/81; 326/83

(58) Field of Search .................. 327/534, 535, 327/537; 326/81, 83; 330/252, 253, 59; 375/316

(56) References Cited

U.S. PATENT DOCUMENTS

| | | | | |
|---|---|---|---|---|
| 5,341,035 A | * | 8/1994 | Shibayama et al. | 327/537 |
| 5,990,741 A | * | 11/1999 | Yamamoto et al. | 330/253 |
| 6,118,303 A | * | 9/2000 | Schmitt et al. | 326/83 |
| 6,130,556 A | * | 10/2000 | Schmitt et al. | 326/81 |
| 6,275,094 B1 | * | 8/2001 | Cranford et al. | 327/534 |

OTHER PUBLICATIONS

Allen, Phillip E., and Holberg, Douglas R.,, "CMOS Analog Circuit Design," pp. 174–175, Holt, Rinehart and Winston, Inc., (1987).

* cited by examiner

Primary Examiner—Stephen Chin
Assistant Examiner—Edith Yeh
(74) Attorney, Agent, or Firm—Vedder, Price, Kaufman & Kammholz, P.C.

(57) ABSTRACT

An integrated circuit receiver includes a differential input receiver having a plurality of differential input transistors. A variable well voltage supply circuit varies the well voltages of the differential input transistors to change the input transistors threshold voltages to provide hysteresis control by varying well voltages of input transistors in opposite directions. A method for reducing noise for an integrated circuit receiver includes receiving an input signal by a differential input receiver, and changing into opposite directions the input transistors threshold voltages to provide hysteresis control by varying the first and second well voltages associated with each of a first differential input transistor and a second differential input transistor. At least one feedback signal is used from the differential input receiver as input to the variable well voltage supply circuit to vary the first and second well voltages to facilitate hysteresis control of the differential input receiver.

19 Claims, 5 Drawing Sheets

DIFFERENTIAL INPUT RECEIVER AND METHOD FOR REDUCING NOISE

RELATED CO-PENDING APPLICATION

This is a related application to co-pending application, entitled "Single Gate Oxide Differential Receiver and Method", having Ser. No. 09/211,469, filed on Dec. 14, 1998, having the same inventor and assigned to instant assignee.

FIELD OF THE INVENTION

The invention relates generally to differential input receivers and more particularly to integrated circuit differential input receivers having hysteresis.

BACKGROUND OF THE INVENTION

Graphics controller chips, like many integrated circuit devices, utilize CMOS, logic cores, and associated input/output (I/O) pads as part of their circuit makeup. I/O pads include, for example, input/output buffers coupled to a common pad or pin. There is a constant challenge to continuously design smaller, faster and more complicated integrated circuits to provide increased functionality for multimedia applications and other applications. Typically, the logic core operates at a different supply voltage than the I/O pads. For example, with logic cores having gate lengths of 0.25 um, a core logic supply voltage may be 2.5 volts, with logic cores having gate lengths of 0.18um, a core supply voltage may be 1.8V. Corresponding supply voltages for the input/output pads, however, may be different supply voltages such as 3.3 volts. However, future generation chips require faster speeds and lower power consumption, hence, lower supply voltages so that the I/O pads can switch at faster frequencies.

Also, integrated circuits must often provide compatibility with older versions of interface circuits. As a result, an integrated circuit may require that the I/O pads operate at either a 3.3 volt level, or for example, at a lower 1.5 volt level. The gate length and gate oxide thickness of I/O pad transistors must also typically be decreased to provide faster circuits that draw less current. With multilevel supply voltages, multi-gate oxide devices are often used to provide the requisite logic levels and overvoltage protection. However, a problem arises when multi-gate oxide transistors are used on the same chip. Using differing gate oxide thickness requires additional fabrication processes and, hence, results in higher fabrication costs. Moreover, the larger gate oxide thickness can slow the device down unnecessarily. For low voltage CMOS signaling, the input/output pad must also be designed to prevent static leakage and prevent damage due to gate-source or gate-drain overvoltage.

FIG. 1 shows a block diagram of a conventional I/O pad 10 including an output buffer 12 and an input buffer 14 coupled to a common pad or pin 16. The I/O pad 10 communicates signals to and from the pad 16 for the core logic 18. Some integrated circuit interfaces such as interfaces that interface a graphics controller chip with other processing chips (e.g. AGP4X and AGP2X) for example are required to work with a 3.3 volt I/O voltage supply as well as with a 1.5 volt voltage supply. At the same time, the core voltage supply for 0.25 micron technology is 2.5 volts. This typically means that the input signal received by the interface chip can have a 0 volt to 1.5 volt swing for one application and 0 volt to 3.3 volt swing for another application. Where thick gate oxide MOS transistors are used for 3.3 volt I/O voltage supplies, they are typically unsuitable for 1.5 voltage supply based circuits because they cannot provide the required timing parameters since they may be too slow at the 1.5 voltage supply. In addition, thin gate oxide MOS transistors cannot typically withstand the 3.3 volt supply for a 3.3 volt input signal environment since a gate-source or gate-drain junction may have a 3.3V potential during normal operation. This may be higher than the normal maximum operating voltage for the device. It has been recommended to use a differential input stage to meet timing parameters and to make these parameters less dependent on temperature and less susceptible to noise.

A common solution to accommodate multiple differing supply voltages for a receiver stage for an I/O pad or other circuit for example has been to make two different integrated circuit chips - one for the 3.3 volt supply and another chip for a 1.5 volt supply. Typically, single (or thin gate) gate oxide differential receivers are designed for 1.5 volt supplies and for 1.5 volt input signals and are on a separate integrated circuit from thick gate oxide differential receivers. Thick gate oxide differential receivers are used to accommodate the 3.3 volt voltage supply for a 3.3 input signal. As such, there are typically two different designs on two different integrated circuit chips.

One solution may be found in co-pending application entitled "Single Gate Oxide Differential Receiver and Method", having Ser. No. 09/211,469, filed on Dec. 14, 1999, by the same inventors and incorporated herein by reference. Such a receiver uses a variable reference voltage to change a differential input switching voltage to improve noise immunity. However, such circuits and methods may draw additional current when the reference voltage is changed to a higher level. This may be due to many such circuits being used in parallel on an integrated circuit die. If lower current consumption is desired, such circuits may not be as suitable as desired.

Consequently, a need exists for an integrated circuit differential input receiver that can provide suitable noise reduction. Moreover, it would be desirable if such a differential receiver was designed as a single gate oxide circuit.

DETAILED DESCRIPTION OF A PREFERRED EMBODIMENT OF THE INVENTION

Briefly, an integrated circuit receiver includes a differential input receiver having a plurality of differential input transistors. A variable well voltage supply circuit varies the well voltages of the differential input transistors to provide hysteresis control. A method for reducing noise for an integrated circuit receiver includes receiving an input signal by a differential input receiver, and changing input transistors threshold voltages by varying the first and second well voltages associated with each of a first differential input transistor and a second differential input transistor. At least one feedback signal is used from the differential input receiver as input to the variable well voltage supply circuit to vary the first and second well voltages to facilitate hysteresis control of the differential input receiver. In a preferred embodiment, well voltages of two differential input transistors are varied in opposite directions to vary their threshold voltages to provide the requisite hysteresis.

Figure 1:
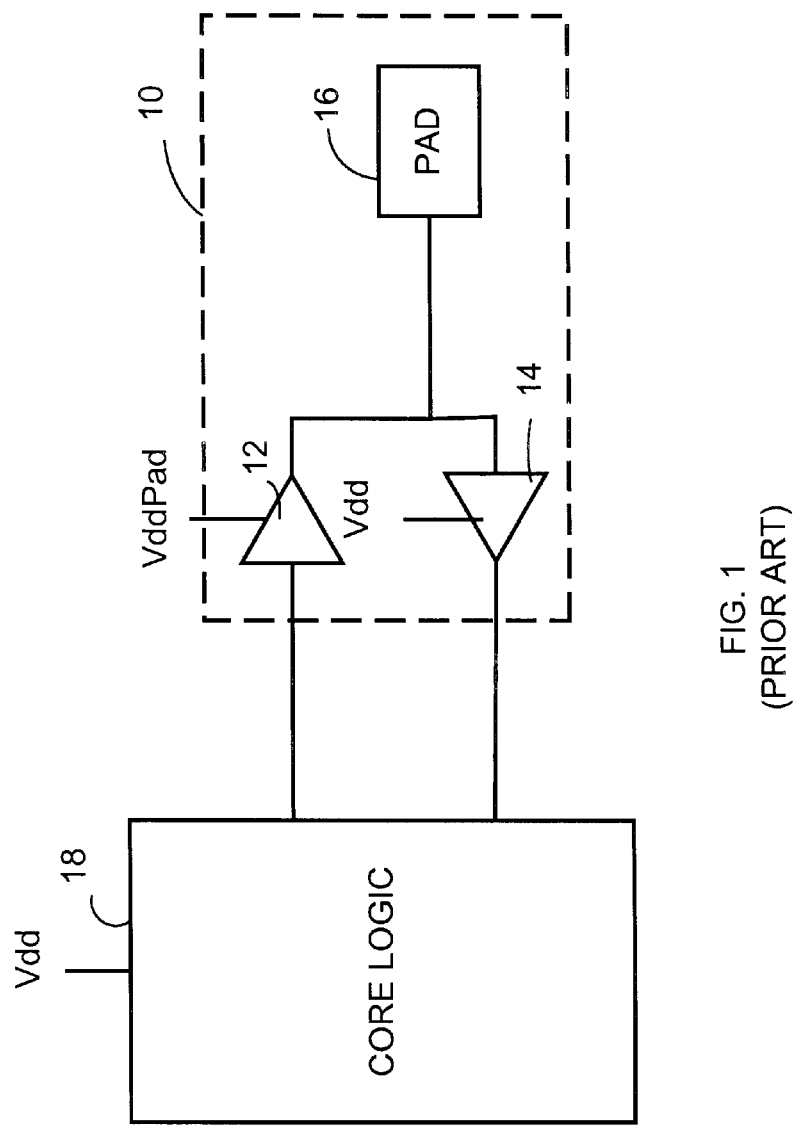
FIG. 1 is a block diagram illustrating a prior art integrated circuit with core logic and an I/O pad having an input buffer (receiver), and an output buffer.
Figure 2:
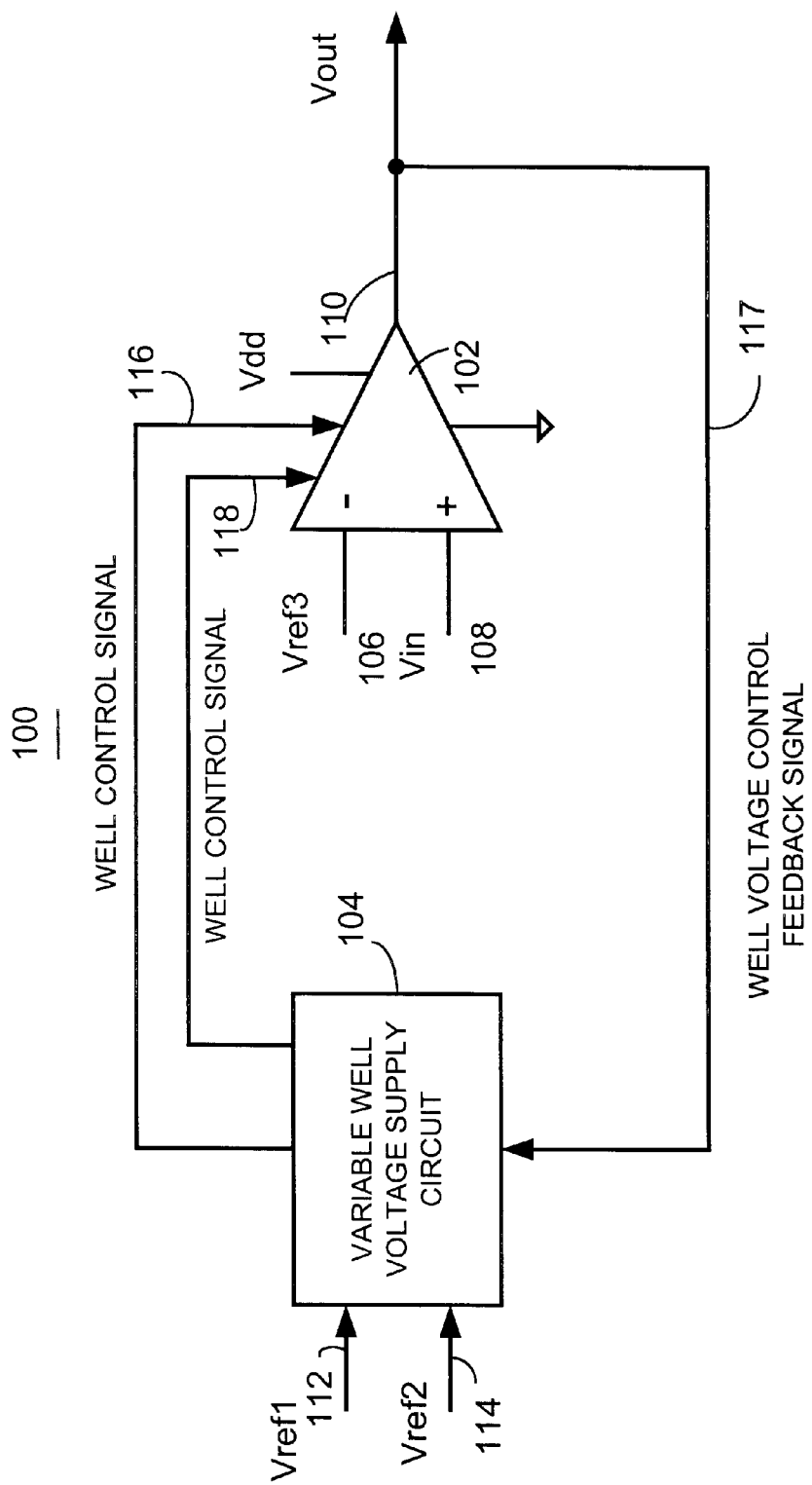
FIG. 2 is a block diagram illustrating one example of an integrated circuit receiver with variable well voltage supply control in accordance with one embodiment of the invention.

FIG. 2 illustrates an example of an integrated circuit receiver 100 having a differential input receiver 102 and a variable well voltage supply circuit 104. The differential input receiver 102 has a first input 106, a second input 108 and an output 110. The first input 106 may be, for example, a negative input whereas the input 108 may be, for example, a positive input. However, depending upon the logic required for a given application, the inputs may be reversed, if desired. A variable well voltage circuit 104 receives a first reference voltage 112, such as a supply voltage to the differential input receiver 102, or any other suitable reference voltage. The variable well voltage supply circuit 104 receives a second reference voltage 114 which may be any suitable reference voltage and in this embodiment, is a lower voltage than the first reference voltage 112. The variable well voltage supply circuit 104 also receives a well voltage control feedback signal 116 from the output 110 of the differential input receiver 102. The variable well voltage supply circuit 104 generates a first well voltage 116 and a second well voltage 118 for differential input transistors associated with the differential input receiver 102. The first and second well voltages 116 and 118 are varied by the variable well voltage supply circuit 104 in response to the well voltage control feedback signal 117 and the reference voltages 112 and 114. The variable well voltage supply circuit varies the first and second well voltages 116 and 118 in opposite directions for the differential input transistors 202 and 208 to vary their threshold voltages. Accordingly, the hysteresis of the differential input receiver 102 is adjusted dynamically in response to changes in the output signal from output 110 by virtue of the feedback signal 117 to the variable well voltage supply circuit 104. The differential input receiver 102 may be any conventional differential input receiver as known in the art. The first input 106, in this embodiment, is also coupled to a third reference voltage such as one half of the supply voltage supplying the differential input receiver. The second input 108 receives the input voltage. As shown, the integrated circuit 100 has a differential amplifier with variable well control based hysteresis.

The differential input receiver 102 receives an input signal at input 108, for example. The variable well voltage supply circuit 104 changes differential input transistors threshold voltages by varying the first and second well voltages 116 and 118 in opposite directions. For example, if well voltage 116 is high, the well voltage 118 will be low. These well voltages are associated with differential input transistors (see FIG. 3).

Figure 3:
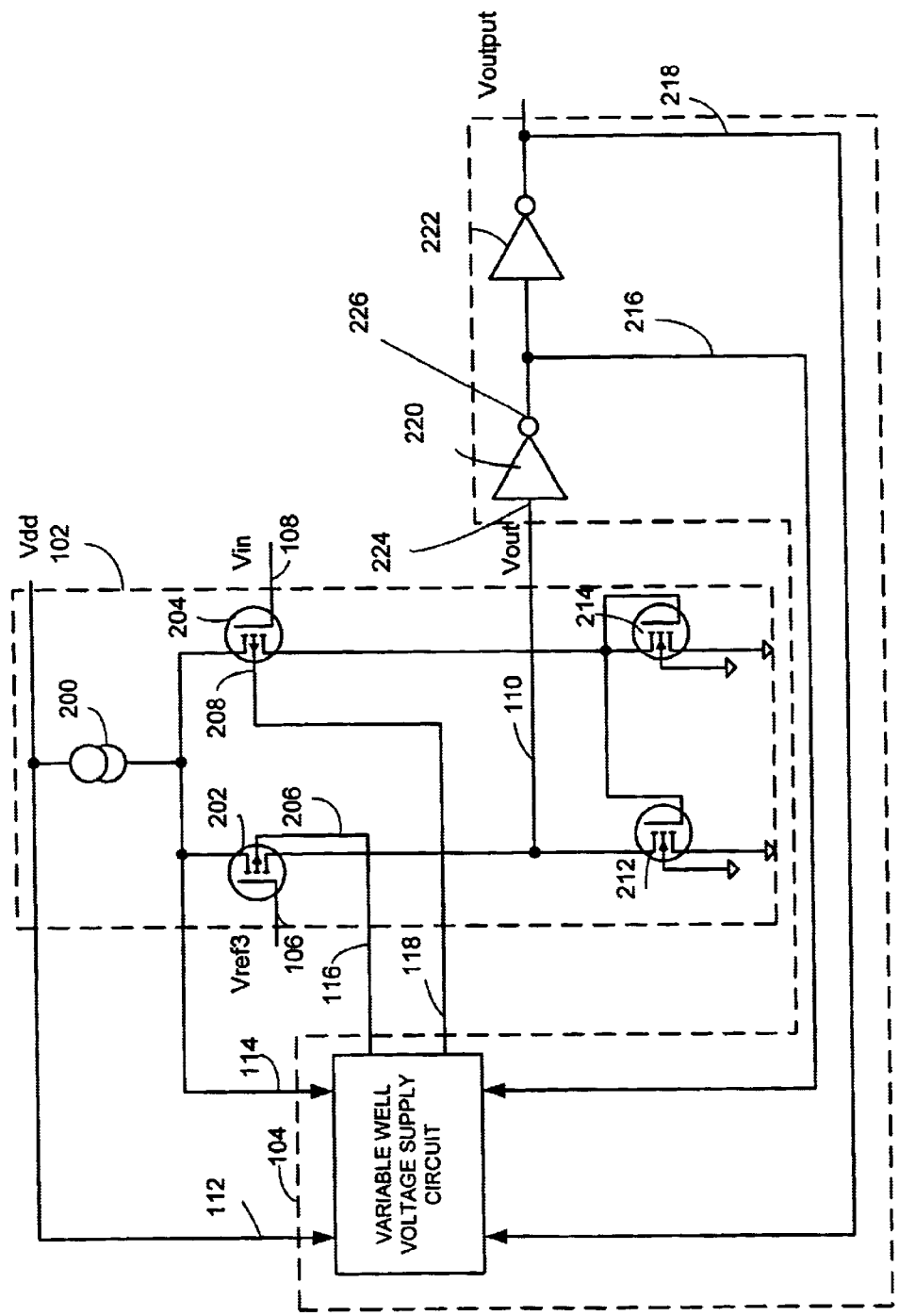
FIG. 3 is a circuit diagram illustrating one example of an integrated circuit receiver in accordance with one embodiment of the invention.

FIG. 3 illustrates in more detail one example of the integrated circuit 100 shown in FIG. 2 wherein the differential input receiver 102 is fabricated from single gate oxide MOSFET transistors. For example, the gate length of these devices may be, for example, 0.18 micrometers (30Å dioxide thickness) or any suitable submicron thickness. The first reference voltage may be, for example, 1.8 V. However, it will be recognized any suitable voltage supply may be used. In addition, for purposes of illustration, and not limitation, the disclosed integrated circuit receiver will be described with reference to pmos and nmos devices. However, it will be recognized that reverse logic may also be used, and that any suitable field effect devices may also be used, if desired.

The differential input receiver 102 includes, for example, a current source 200 operatively coupled to a first differential input transistor 202 and a second differential input transistor 204. The first and second differential input transistors 202 and 204 may be, for example, pmos transistors having N wells shown as 206 and 208, respectively. The first differential input transistor 202 is operatively coupled to receive the reference voltage 106 which in this case may be, for example, Vdd/2. Similarly, the second differential input transistor 204 has an input that receives the input voltage 108. The N wells 206 and 208 of the first and second differential input transistors 202 and 204 receive the well control signals 116 and 118, respectively. As with conventional differential input receivers, nmos transistors 212 and 214 have drains operatively coupled to the drains of first and second differential input transistors 202 and 204. The first differential input transistor 202 has an output 110 from its drain. Also, the differential input receiver 102 provides the second reference voltage 114 for the variable well voltage supply circuit 104. However, it will be recognized that any suitable reference voltage may also be used.

As shown, a plurality of well voltage control feedback signals 216, 218 serve as the well voltage control feedback signal 117 in this embodiment. The feedback signal 117 serves as an input to the variable well voltage supply circuit 104 so that the variable well voltage supply circuit 104 can dynamically vary the first and second well voltages 116 and 118 based on the feedback signal to facilitate hysteresis control of the differential input receiver 102.

The integrated circuit receiver 100, in this embodiment, also includes a first inverter 220 and a second inverter 222 connected in series. The first inverter 220 has an input 224 operatively coupled to the output of the differential input receiver and has an output 226 that supplies the well voltage control feedback signal 216 to the variable well voltage supply circuit 104. The second inverter 222 is operatively coupled to the first inverter 220 and operatively coupled to the variable well voltage supply circuit 104 through the feedback signal 218. Accordingly, a plurality of feedback signals 216 and 218 are provided as inputs for the variable well voltage supply circuit.

Figure 4:
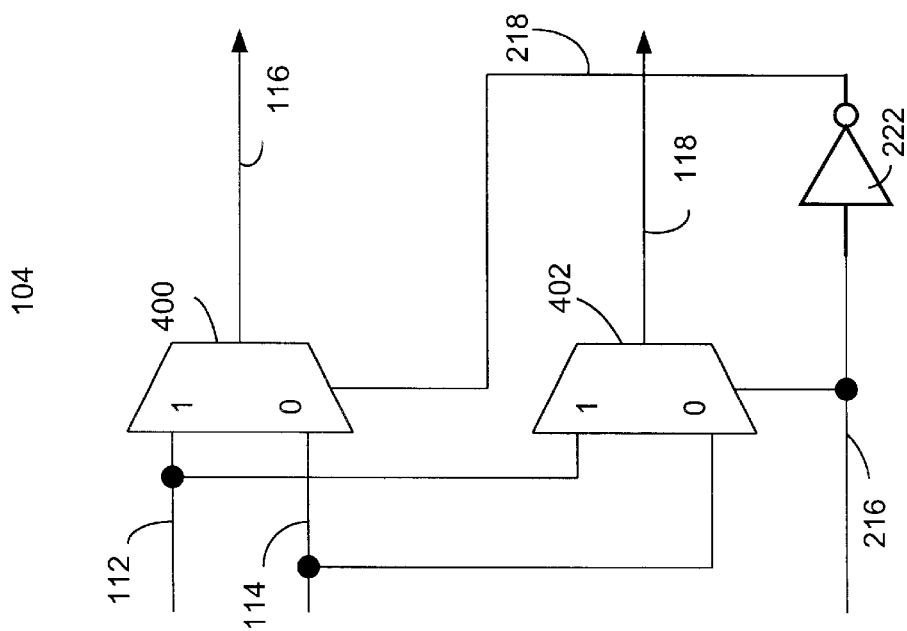
FIG. 4 is a circuit diagram illustrating one example of a variable well voltage supply circuit in accordance with one embodiment of the invention.

FIG. 4 shows one example of the variable well supply voltage circuit 104 having a first multiplexing circuit 400 and a second multiplexing circuit 402. The well voltage control feedback signal 216 serves as a control signal for the second multiplexing circuit 402. The inverted feedback signal 218 serves as the control signal for the first multiplexing circuit 400. The first multiplexing circuit selects one of the first or second reference voltages 112 or 114 as the well control signal 116. Similarly, the second multiplexing circuit 402 selects one of the two first or second reference voltages 112 or 114 as the second well control signal 118, depending upon the level of the feedback signal 216.

Figure 5:
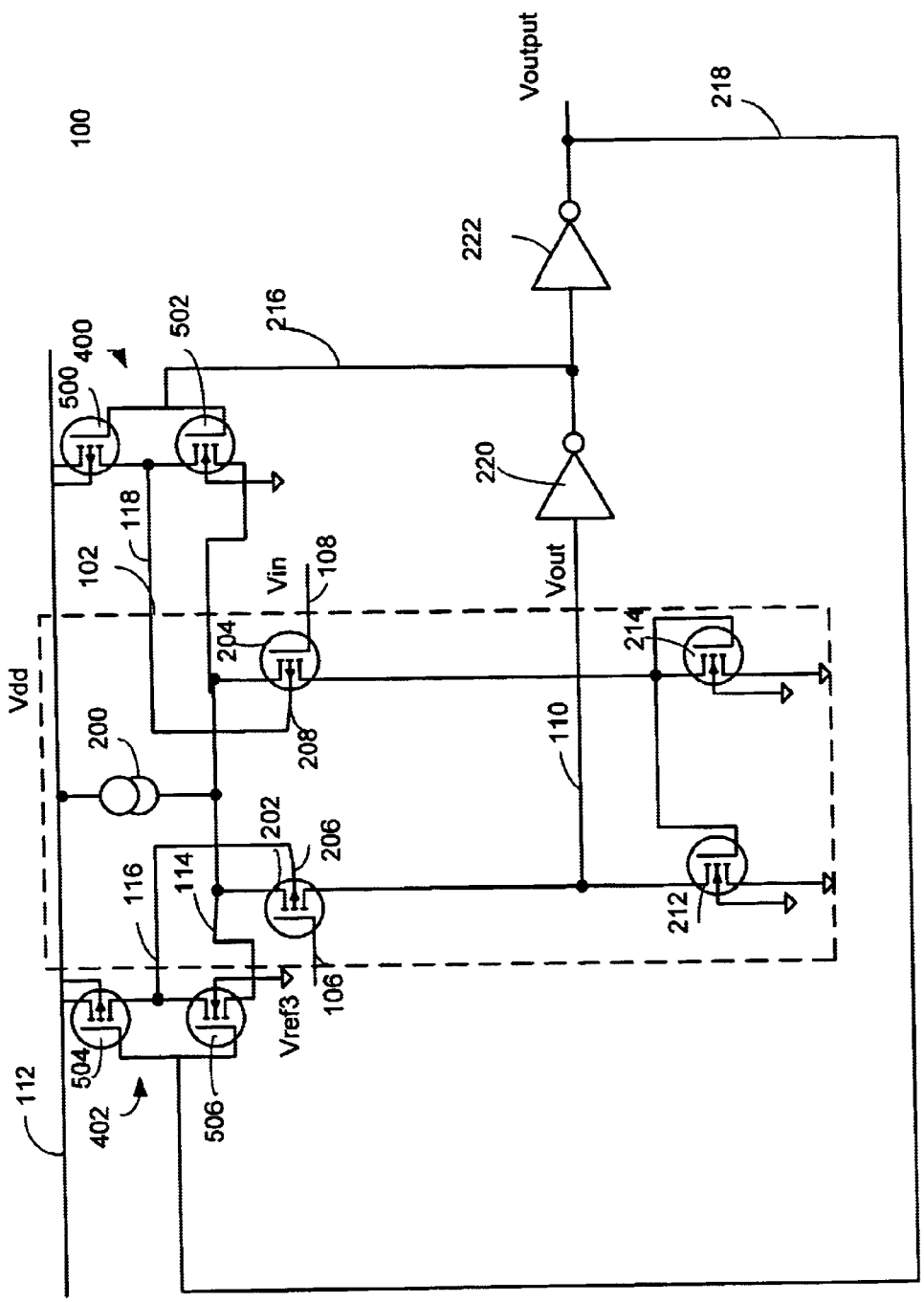
FIG. 5 is a circuit diagram illustrating in more detail one embodiment of an integrated circuit receiver in accordance with one embodiment of the invention.

FIG. 5 illustrates in more detail a circuit diagram of one embodiment of an integrated circuit receiver 100. In this embodiment, the multiplexing circuits 400 and 402 are made of a pmos and nmos transistor combination as shown. The current source 200 is also comprised of pmos and nmos transistors as known in conventional differential input receivers.

The multiplexing circuit 400 includes pmos transistor 500 and nmos transistor 502 wherein the drain of the pmos transistor 500 is coupled to the drain of the nmos transistor 502. The drains provide the well control signal 118 to the well of the differential input transistor 204. Similarly, multiplexing circuit 402 includes pmos transistor 504 and nmos transistor 506 wherein the drains of these transistors are operatively coupled and provide the well control signal 116 for the differential input transistor 202.

In operation, the variable well voltage supply circuit receives the first and second reference voltage and at least one feedback signal from the differential input receiver for use in varying the first and second well voltages to facilitate hysteresis control. The integrated circuit receiver inverts an output 110 from a differential input receiver to provide a first feedback signal and, where multiple inverters are used, again inverts the first feedback signal to provide a second feedback signal which is feedback signal 218, when the feedback signals are used to vary the first and second well voltages 116 and 118. More particularly, when the input voltage 108 is greater than the reference voltage 106, the output 110 is a logic "high" making the output of the inverter 220 0 V. The inverted output signal 110 therefore provides a 0 V feedback signal 216 to multiplexing circuit 400. The inverted feedback signal 218 is then approximately the supply voltage or reference voltage 112. This provides a well voltage value for well voltage 116 to be approximately equal to the second reference voltage 114. The second well voltage 118 is approximately then equal to the first voltage 112, namely the supply voltage. If in that case the output voltage 108 goes lower then the reference voltage 106, then transistor 204 threshold voltage is bigger then transistor 202 threshold voltage. That means the input voltage 108 must go much lower then the reference voltage to force Voutput to go down.

Where the input signal 108 is less than the reference voltage 106, the output voltage is a logic "low". Accordingly, the inverted output voltage, namely the feedback signal 216, is at a high logic level. This then becomes inverted to provide the second feedback signal 218 which is then approximately 0 V. In this case, the well control signal 116 is approximately equal to Vdd, and the second well control signal 118 is equal to the second reference voltage 114 which is less than Vdd. If in that case the input voltage 108 goes higher then the reference voltage 106, then a transistor 204 threshold voltage is smaller than the transistor 202 threshold voltage. As a result, the input voltage 108 must go much higher then the reference voltage 106 to force Voutput to go up.

The above integrated circuit receiver and method avoids the initial current draw found in voltage reference controlled integrated receivers as suggested in other solutions. Moreover, a hysteresis effect is provided depending upon the output voltage of the differential input receiver. The selective opposite control of the N well voltage to the differential input transistors effectively varies the input transistors threshold voltages.

Moreover, all of the transistors described herein and inverters are made from a single gate oxide thickness, such as 30A, to facilitate reduced cost in manufacturing and improve yields during fabrication. However, it will be recognized that dual gate oxide thicknesses may also be used, if desired. In addition, it will be recognized that the differential input receiver may be fabricated using non-symmetrical configurations for the input transistors and accordingly, a single feedback signal may be used.

It should be understood that the implementation of other variations and modifications of the invention in its various aspects will be apparent to those of ordinary skill in the art, and that the invention is not limited by the specific embodiments described. It is therefore contemplated to cover by the present invention, any and all modifications, variations, or equivalents that fall within the spirit and scope of the basic underlying principles disclosed and claimed herein.

What is claimed is:

1. An integrated circuit receiver comprising:
   a differential input receiver having a first differential input transistor, a second differential input transistor and an output; and
   a variable well voltage supply circuit operatively responsive to the output and operatively coupled to vary a first well voltage associated with the first differential input transistor and a second well voltage associated with the second differential input transistor.

2. The receiver of claim 1 wherein the variable well voltage supply circuit is operatively responsive to a first reference voltage and a second reference voltage such that variable well voltage supply circuit changes the input transistors threshold voltages by varying the first and second well voltages associated with each of the first differential input transistor and second differential input transistors in opposite directions.

3. The receiver of claim 1 wherein the first differential input transistor has an input that is operatively coupled to receive a third reference voltage, and wherein the second differential input transistor has a input that is operatively coupled to receive an input voltage.

4. The receiver of claim 2 wherein the differential input receiver provides the second reference voltage.

5. The receiver of claim 1 including at least one well voltage control feedback signal from the output of the differential input receiver, for the variable well voltage supply circuit wherein the variable well voltage supply circuit dynamically varies the first and second well voltages based on the well voltage control feedback signal to facilitate hysteresis control of the differential input receiver.

6. The receiver of claim 1 including a first inverter having an input operatively coupled to the output of the differential input receiver and to the variable well voltage supply circuit, and a second inverter operatively coupled to the first inverter and operatively coupled to the variable well voltage supply circuit such that a plurality of well voltage control feedback signals are provided from the first and second inverters as inputs for the variable well voltage supply circuit.

7. The receiver of claim 1 wherein the first differential input transistor and the second differential input transistors are PMOS transistors and wherein the wells of the first differential input transistor and the second differential input transistor are N wells.

8. The receiver of claim 6 wherein the variable well voltage supply circuit includes a first multiplexing circuit operatively responsive to a first well voltage control feedback signal from the first inverter to provide the second well voltage and a second multiplexing circuit operatively responsive to a second well voltage control feedback signal from the second inverter to provide the first well voltage.

9. The receiver of claim 2 wherein the first reference voltage is higher than the second reference voltage.

10. An integrated circuit receiver comprising:
    a differential input receiver having a first differential input transistor, a second differential input transistor and an output, wherein the first differential input transistor has an input that is operatively coupled to receive a first reference voltage, and wherein the second differential input transistor has a input that is operatively coupled to receive an input voltage; and a variable well voltage supply circuit operatively responsive to the output, a second reference voltage and a third reference voltage such that the variable well voltage supply circuit changes the input transistors threshold voltages by varying the first and second well voltages associated with each of the first differential input transistor and second differential input transistors in opposite directions.

11. The receiver of claim 10 wherein the differential input receiver provides the third reference voltage.

12. The receiver of claim 11 including at least one well voltage control feedback signal from the output of the differential input receiver, for the variable well voltage supply circuit wherein the variable well voltage supply circuit dynamically varies the first and second well voltages based on the well voltage control feedback signal to facilitate hysteresis control of the differential input receiver.

13. The receiver of claim 10 including a first inverter having an input operatively coupled to the output of the differential input receiver and to the variable well voltage supply circuit, and a second inverter operatively coupled to the first inverter and operatively coupled to the variable well voltage supply circuit such that a plurality of well voltage control feedback signals are provided from the first and second inverters as inputs for the variable well voltage supply circuit.

14. The receiver of claim 13 wherein the first differential input transistor and the second differential input transistors are PMOS transistors and wherein the wells of the first differential input transistor and the second differential input transistor are N wells.

15. The receiver of claim 12 wherein the variable well voltage supply circuit includes a first multiplexing circuit operatively responsive to a first well voltage control feedback signal from the first inverter to provide the second well voltage and a second multiplexing circuit operatively responsive to a second well voltage control feedback signal from the second inverter to provide the first well voltage.

16. The receiver of claim 15 wherein the first reference voltage is higher than the second reference voltage.

17. A method for reducing noise for an integrated circuit receiver comprising the steps of:

receiving an input signal by a differential input receiver; and changing the input transistors threshold voltages to provide differential receiver hysteresis by varying a first and a second well voltage associated with each of a first differential input transistor and a second differential input transistor in the differential input receiver.

18. The method of claim 17 including the step of receiving a first reference voltage, a second reference voltage and at least one well voltage control feedback signal from the differential input receiver for use in varying the first and second well voltages in opposite directions to facilitate hysteresis control of the differential input receiver.

19. The method of claim 18 including the steps of inverting an output from the differential input receiver to provide a first well voltage control feedback signal and again inverting the first well voltage control feedback signal to provide a second well voltage control feedback signal wherein the first and second well voltage control feedback signals are used to vary the first and second well voltages.

* * * * *